Figures 1, 3:
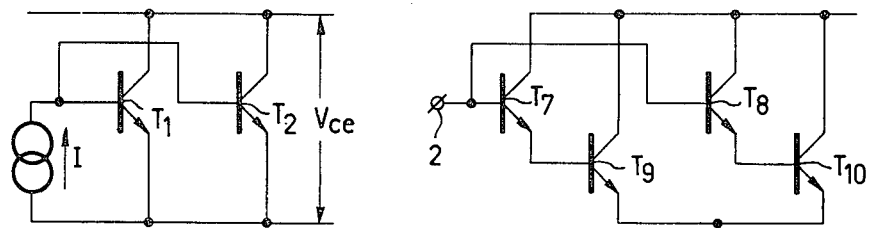

[19] United States Patent

Smulders

[11] 3,952,258

[45] Apr. 20, 1976

[54] PARALLEL-CONNECTION OF SEMICONDUCTOR SYSTEMS WITH AN ARRANGEMENT FOR PREVENTING THERMAL INSTABILITY

[75] Inventor: Walter Henricus Maria Magdala Smulders, Nijmegen, Netherlands

[73] Assignee: U.S. Philips Corporation, New York, N.Y.

[22] Filed: Apr. 11, 1975

[21] Appl. No.: 567,304

[30] Foreign Application Priority Data
Apr. 18, 1974 Netherlands....................... 7405237

[52] U.S. Cl. ................................. 330/23; 330/38 M
[51] Int. Cl.² ........................................ H23F 3/04
[58] Field of Search ..................... 330/23, 38 M, 20; 307/310; 357/28

[56] References Cited
UNITED STATES PATENTS
3,667,064   5/1972   Thornton et al...................... 330/23

Primary Examiner—James B. Mullins
Attorney, Agent, or Firm—Frank R. Trifari; Bernard Franzblau

[57] ABSTRACT

The invention describes how semiconductor configurations can be connected in parallel so as to prevent thermal instability. For this purpose each output transistor has the strongest thermal coupling with a driver transistor other than that to which it is electrically coupled, preferably that electrical coupling which is thermally weakest.

5 Claims, 5 Drawing Figures

PARALLEL-CONNECTION OF SEMICONDUCTOR SYSTEMS WITH AN ARRANGEMENT FOR PREVENTING THERMAL INSTABILITY

The invention relates to an amplifier arrangement which at least in respect of the d.c. setting consists of a multiplicity of parallel branches, each of which comprises at least a driver and an output transistor, an output of each driver transistor being individually electrically coupled to the input of the output transistor.

Driver transistor is to be understood to mean that transistor or transistor configuration which receives the drive signal and output transistor means that transistor or transistor configuration which supplies the amplified signal to the load.

It is a known phenomenon that as the temperature increases owing to increasing dissipation, the differential base-emitter input resistance of a transistor may become negative, i.e. that at increasing base current the base-emitter voltages decreases. When a multiplicity of transistors are connected in parallel with respect to their d.c. setting. — which is to be understood to mean that on the one hand their base-emitter input circuits and on the other hand their collector-emitter output circuits are included in parallel branches —, the parallel connection will become unstable when the temperature is reached at which the differential input resistance becomes negative. As a result, the current will no longer be distributed uniformly among the parallel branches and in the worst case it will flow through one branch only. This means that it is not readily possible to connect a multiplicity of transistors in parallel so as to increase the permissible overall power dissipation. Also in the case of power transistors whose internal structure corresponds to a multiplicity of parallel-connected transistors, this unstable effect occurs ("forward second breakdown" or also "thermal breakdown"); the same applies to power output stages of integrated circuits with parallel-connected transistors or transistor configurations.

A known solution for the said problem is to include resistors in each of the emitter circuits of the parallel-connected transistors. As a result of this the differential input resistance will become negative only at a higher dissipation level.

One drawback of said method is that the permissible dissipation is merely increased, and that the included resistors cause voltage and power losses and, moreover, are less desirable in integrated circuits.

It is an object of the invention to indicate how transistors can be connected in parallel without the occurrence of said problems.

The invention is therefore characterized in that the transistors are geometrically arranged so that each output transistor has the strongest thermal coupling with a driver transistor other than that with which it is electrically coupled and preferably has the weakest thermal coupling with that driver transistor with which it is electrically coupled.

Figure 2:
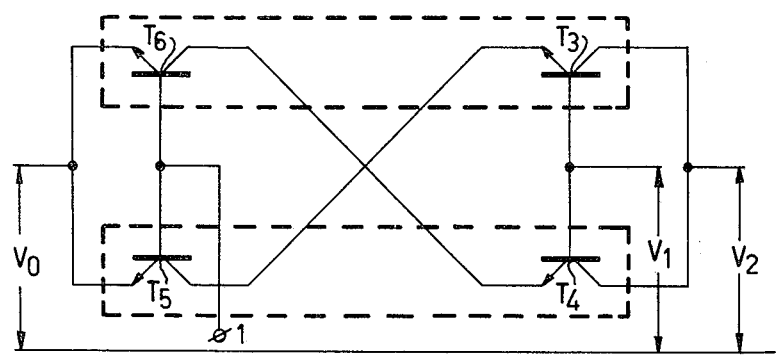
Figure 4:
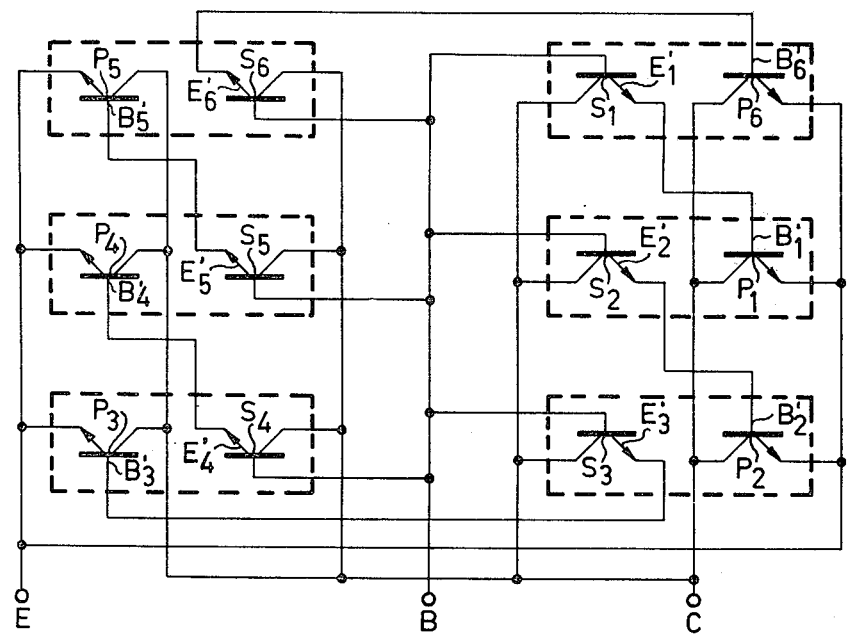
Figure 5:
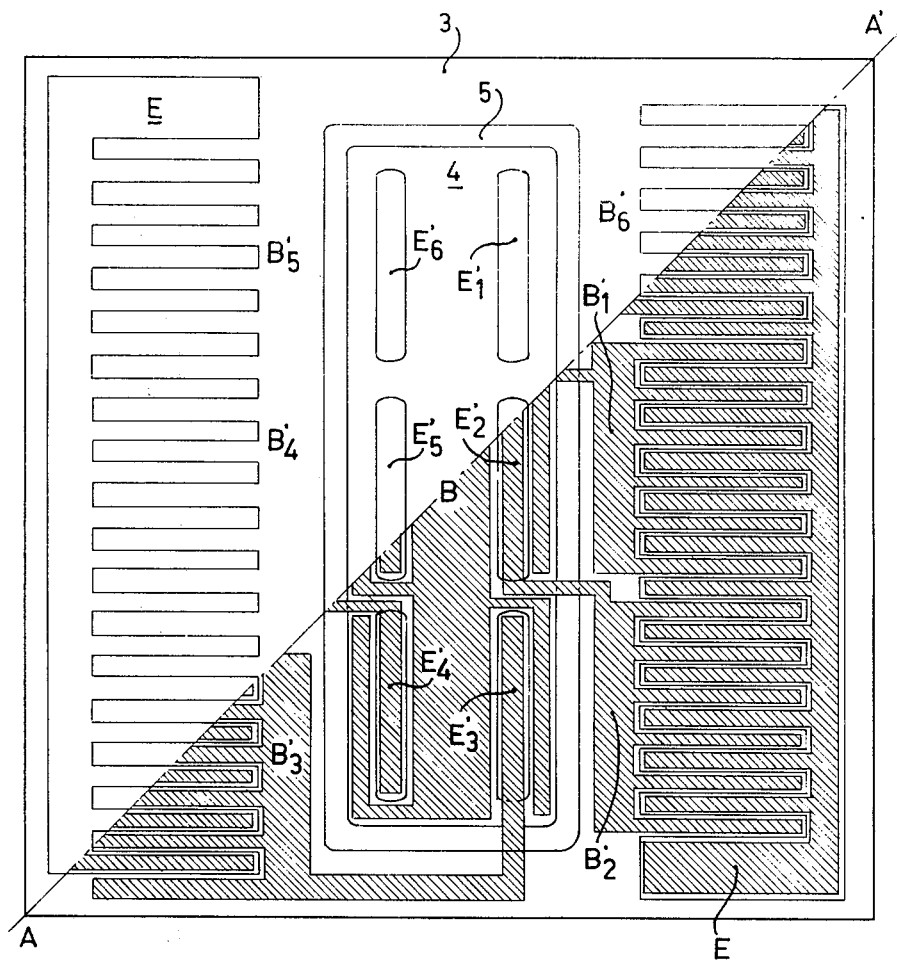

The invention will be described in more detail with reference to the Figures, in which FIG. 1 shows two parallel-connected transistors, FIG. 2 shows two cascode pairs connected in parallel according to the invention, FIG. 3 shows two Darlington pairs connected in parallel according to the invention, FIG. 4 shows six Darlington pairs connected in parallel according to the invention, and FIG. 5 schematically represents the arrangement of FIG. 4 in integrated form.

FIG. 1 shows two transistors $T_1$ and $T_2$ with common collector, base and emitter circuits. Under operating conditions an instantaneous voltage $V_{ce}$ exists between the common collector and emitter, while the common base circuit includes a current source. The current I of said current source is distributed equally over the two bases when the transistors $T_1$ and $T_2$ are identical, so that the two transistors will carry an equal collector current $I_c$.

The dissipated power per transistor is then equal to $I_c V_{ce}$. When the total current I increases, the collector currents and the dissipation in the two transistors initially also increase to the same extent. At increasing collector current and constant temperature the base-emitter voltage increases, while at constant collector current and an increasing temperature the base-emitter voltage decreases. However, in practice the dissipation and hence the temperature increases at increasing collector current, which may result in the decrease of the base-emitter voltage owing to the temperature rise becoming predominant over the increase caused by the increasing collector current, so that the differential input resistance becomes negative. Both in theory and in practice it appears that the negative differential input resistance will occur when the temperature rise owing to the dissipation is approx. 16°C.

When it is assumed that in the above-mentioned situation the transistor $T_1$ will carry slightly more current than transistor $T_2$ owing to a small deviation in the transistor characteristics or in the temperature, the dissipation in transistor $T_1$ increases and that in the transistor $T_2$ decreases. Owing to the temperature rise in transistor $T_1$ and the temperature decrease in transistor $T_2$, the transistor $T_1$ will take up a greater part of the current I than transistor $T_2$. As a result of this, the collector current of transistor $T_1$ increases and the collector current of transistor $T_2$ decreases. This results in an increase of the dissipation in transistor $T_1$ and a reduced dissipation in transistor $T_2$. Thus, in respect of the increase of the collector current of transistor $T_1$ a positively feed back system is obtained and eventually the current I will flow almost completely in the base circuit of transistor $T_1$, whereas transistor $T_2$ becomes currentless.

This behaviour implies that mere parallel connection of transistors does not ensure an increase of the maximum power to be dissipated with respect to that of a single transistor.

A known solution is then to include resistors in the emitter circuits of the transistors. As a result of this, the point at which the differential input resistance becomes negative is attained at a higher temperature rise than in the situation of FIG. 1. Said solution has a number of previously mentioned drawbacks.

In the solution according to the invention, which does not have said drawbacks, it is not the individual transistors that are connected in parallel but rather combinations of at least one driver and output transistor, the various driver transistors being thermally coupled to the various output transistors in a manner according to the invention. Said method can best be explained by means of some examples.

A first example is the replacement of the transistors by cascoded transistor pairs, which is shown in FIG. 2 for two parallel cascode pairs consisting of the transistors $T_3$, $T_5$ and $T_4$, $T_6$. The Figure represents the situation for d.c.. The a.c. situation may differ from this. For example, the input signal voltage may be applied to the bases of the transistors $T_5$ and $T_6$ in phase and also in push-pull. The same applies to the output signal voltage, which may for example be taken off in push-pull from resistors which are included in the individual collector circuits of the transistors $T_3$ and $T_4$.

The collectors of the transistors $T_3$ and $T_4$ are interconnected and the bases are also interconnected. The emitter of transistor $T_3$ is connected to the collector of transistor $T_5$, while the emitter of transistor $T_4$ is connected to the collector of transistor $T_6$. The bases of the transistors $T_5$ and $T_6$ are connected to a drive input terminal 1. In respect of the setting of the transistors the common collector of the transistors $T_3$ and $T_4$ is at a potential $V_2$ and the common base at a potential $V_1$. The common emitter of the transistors $T_5$ and $T_6$ is at a potential $V_0$.

The dissipation of the driver transistors $T_5$ and $T_6$ is proportional to the voltage $V_1-V_0$, while the dissipation of the transistors $T_3$ and $T_4$ is proportional to the voltage $V_2-V_1$. The setting is such that $V_2-V_1>>V_1-V_0$, so that the driver transistors $T_5$ and $T_6$ have a low dissipation relative to the output transistors $T_3$ and $T_4$. The geometrical configuration is such that the thermal coupling between the transistors $T_3$ and $T_6$ and between the transistors $T_4$ and $T_5$ is substantially stronger than the other thermal couplings, for example as obtained by accommodating the transistors $T_3$ and $T_6$ as well as the transistors $T_4$ and $T_5$ each in a separate casing in the case of discrete circuitry. The strongest thermal couplings are denoted in the Figure by means of dotted blocks.

Assume that the current through the collector-emitter paths of the transistors $T_3$ and $T_5$ increases; the current through the collector-emitter paths of the transistors $T_4$ and $T_6$ will then decrease. The dissipation and thus the temperature of the transistor $T_3$ increases and the dissipation and thus the temperature of transistor $T_4$ decreases. Owing to the thermal couplings the temperature of the driver transistor $T_6$ will increase and the temperature of the driver transistor $T_5$ will decrease. As the base-emitter junctions of the two driver transistors are connected in parallel, the base-emitter voltages cannot vary freely with the temperature. Therefore, the temperature increase of transistor $T_6$ and the temperature decrease of transistor $T_4$ is compensated by a current decrease and a current increase respectively. These current variations are exactly opposed to the current variations caused by the temperature variation, so that owing to the thermal couplings the current variations in the two parallel branches are negatively fed back instead of positively fed back, as is the case in the circuit arrangement of FIG. 1.

Another known combination of a driver and an output transistor, which can take over the function of a single transistor, is the so-called Darlington arrangement.

FIG. 3 shows two parallel-connected branches, which each consist of a Darlington circuit for which, similarly to the circuit of FIG. 2, it is to be noted that the situation for d.c. may be different. The transistors $T_7$ and $T_9$ form a Darlington circuit and so do the transistors $T_8$ and $T_{10}$. In this circuit arrangement the collectors of the transistors $T_7$, $T_8$, $T_9$ and $T_{10}$ are all mutually connected. The emitter of transistor $T_7$ is connected to the base of transistor $T_9$ and similarly the emitter of transistor $T_8$ is connected to the base of transistor $T_{10}$. The emitters of the transistors $T_9$ and $T_{10}$ are connected to a current source I, whilst the bases of the transistors $T_7$ and $T_8$ are connected to an input terminal 2. According to the invention the transistors are geometrically arranged in such a way that the driver transistor $T_7$ has a strong thermal coupling with the output transistor $T_{10}$ and that the driver transistor $T_8$ has a strong thermal coupling with the output transistor $T_9$. The driver transistors $T_7$ and $T_8$ automatically have a substantially lower dissipation than the output transistors $T_9$ and $T_{10}$ because the driver transistors merely supply the base currents for the output transistors.

Assume that the collector current of the output transistor $T_9$ increases. As a result, the collector current of output transistor $T_{10}$ decreases. Consequently, the dissipation in output transistor $T_9$ increases and that in output transistor $T_{10}$ decreases. Owing to the thermal couplings the temperature of driver transistor $T_8$ increases and the temperature of driver transistor $T_7$ decreases. The base-emitter voltage of driver transistor $T_8$ would consequently decrease and the base-emitter voltage of driver transistor $T_7$ would increase, if the series-connection of the base-emitter junctions of the transistors $T_7$ and $T_9$ were not connected in parallel with the series-connection of the base-emitter junctions of the transistors $T_8$ and $T_{10}$. This parallel connection results in the temperature variation being compensated by a current variation, in such a way that the collector current of transistor $T_7$ decreases and that of transistor $T_8$ increases. Thus, a negative feedback is operative which at least limits the increase of the collector current of transistor $T_9$. Similarly, said negative feedback is effective in respect of the increase of the collector current of the transistor $T_{10}$. Thus, both parallel branches retain a stable current distribution.

In the manner as shown in FIGS. 2 and 3, in principle as many branches as desired may be connected in parallel.

FIG. 4 schematically shows the parallel connection of six branches, each comprising a driver and an output transistor. The driver transistors are designated $S_1$ through $S_6$ and the output transistors $P_1$ through $P_6$. In each branch the driver and the output transistor are connected as a Darlington pair, for example the combination of driver transistor $S_1$ with output transistor $P_1$. The collectors of all transistors are connected to the common-collector terminal C. The bases of the driver transistors are connected to the common-base terminal B and the emitters of the output transistors are connected to the common-emitter terminal E. The bases of the output transistors ($B_1'$ through $B_6'$) are each connected to the emitter of the associated driver transistor ($E_1'$ through $E_6'$), whilst the transistors are geometrically arranged in such a manner that a strong thermal coupling exists between each driver transistor and an output transistor other than the associated output transistor ($S_1$ with $P_6$, $S_2$ with $P_1$ etc.) as indicated by the dotted blocks. The circuit, viewed from the terminals C, B and E constitutes a Darlington arrangement with a maximum permissible dissipation which is six times as high as the maximum permissible dissipation of a single Darlington arrangement with the same transistors. The circuit arrangement of FIG. 4 is also suitable to be realized in the form of an integrated circuit.

FIG. 5 schematically represents the layout of the circuit arrangement of FIG. 4 as an integrated circuit. In said Figure the various emitter and base zones are designated in accordance with FIG. 4. The drawing shows two parts of the circuit which are mirror-symmetrical relative to each other and which are separated by the diagonal AA'. The top left part shows the circuit without the various contacting surfaces and tracks, which are shown shaded in the bottom-right part. The semiconductor element consists of n-type material which forms the common collector C. In this collector material two base zones 3 and 4 are obtained by diffusion of p-type material. These base zones are isolated by region 5 which forms part of the collector C. The base zone 4 within the region 5 constitutes the common base B of the driver transistors $S_1$ through $S_6$. In these base zones six emitter zones are provided by diffusion of n-type material, which constitute the emitters $E_1'$ through $E_6'$ of the driver transistors. The emitter zones are provided with contact tracks, whilst the base zone 4, wherever possible, is covered by a contacting surface so as to reduce the resistance to the active part of the base zone B. Thus, the driver transistors $S_1$ through $S_6$ are formed in the internal base region 4. In the external base zone 3 the emitter zone E is provided by diffusion of n-type material. The emitter zone consists of two comb-shaped regions, so as to obtain a large base-emitter interface. Generally the two emitter regions are externally interconnected. Moreover, the emitter zone E are fully covered by a contacting surface. The comb-shaped base zone which meshes with the emitter zone E is covered by six separate comb-shaped contacting surfaces. As the resistance of the p-type material is so high that interruption of the contacting surface provides an adequate electrical isolation, the bases $B_1'$ through $B_6'$ are thus obtained. In the region 4 the output transistors $P_1$ through $P_6$ are thus obtained. The transistors $P_1$ through $P_6$ are arranged so that they are disposed cyclically offset adjacent the driver transistors $S_1$ through $S_6$. In other words, output transistor $P_6$ geometrically adjoins driver transistor $S_1$ etc. Thus the thermal coupling between driver transistor $S_1$ and output transistor $P_6$ is stronger than the thermal couplings of driver transistor $S_1$ with the other output transistors. In a similar way the driver transistors $S_2$ through $S_6$ are thermally coupled with the output transistors $P_1$ through $P_5$. The electrical coupling between the driver and output transistors is effected by means of contacting tracks which connect the emitters $E_1'$ through $E_6'$ to the corresponding bases $B_1'$ through $B_6'$, as appears from the shading.

In the above-mentioned manner an integrated circuit according to the invention is obtained.

It is obvious that the scope of the invention is not limited to the embodiments shown. Various semiconductor configurations may be connected in parallel in a manner according to the invention provided that they comply with the requirement that the currents in driver and output transistors are in phase, i.e. that an increase of the output current of the driver transistor causes an increase of the collector current in the output transistor.

What is claimed is:

1. An amplifier arrangement which at least in respect of the d.c. setting comprises a multiplicity of parallel branches, each of which branches comprises at least a driver and an output transistor, means electrically coupling an output of each driver transistor individually to the input of the output transistor, characterized in that the transistors are geometrically arranged so that each output transistor has the strongest thermal coupling with a driver transistor other than that with which it is electrically coupled, and preferably has the weakest coupling with that driver transistor with which it is electrically coupled.

2. An amplifier arrangement as claimed in claim 1, characterized in that the electrical coupling between said driver transistor and its associated output transistor is such that these transistors form a cascode arrangement.

3. An amplifier arrangement as claimed in claim 1, characterized in that said driver transistor and its associated output transistor are electrically coupled so as to form a Darlington arrangement.

4. An amplifier arrangement as claimed in claim 1, characterized in that the arrangement takes the form of a monolithic integrated circuit.

5. An amplifier arrangement as claimed in claim 4, characterized in that the output transistors are cyclically offset relative to the electrically associated driver transistors.

* * * * *